(12) United States Patent
Chen et al.

(10) Patent No.: US 7,669,171 B2
(45) Date of Patent: Feb. 23, 2010

(54) PREDICTION MODEL AND PREDICTION METHOD FOR EXPOSURE DOSE

(75) Inventors: Ju-Te Chen, Tainan (TW); Chung-An Chen, Taichung (TW); Chi-Ching Huang, Tainan County (TW); Wen-Tsung Wu, Kaohsiung County (TW); Shih-Ming Yen, Kaohsiung (TW)

(73) Assignee: United Miceoelectronics Corp., Hsinchu (TW)

( * ) Notice: Subject to any disclaimer, the term of this patent is extended or adjusted under 35 U.S.C. 154(b) by 288 days.

(21) Appl. No.: 11/850,513

(22) Filed: Sep. 5, 2007

(65) Prior Publication Data

US 2009/0064084 A1 Mar. 5, 2009

(51) Int. Cl.
*G06F 17/50* (2006.01)
*G06F 19/00* (2006.01)

(52) U.S. Cl. .......................... 716/19; 700/120; 700/121

(58) Field of Classification Search .................. 716/19; 700/120, 121
See application file for complete search history.

(56) References Cited

U.S. PATENT DOCUMENTS

| | | | |
|---|---|---|---|
| 5,657,235 A * | 8/1997 | Liebmann et al. ........... 700/182 |
| 6,557,163 B1 | 4/2003 | Rankin et al. |
| 6,567,972 B1 * | 5/2003 | Tanaka et al. ................. 716/21 |
| 6,883,158 B1 * | 4/2005 | Sandstrom et al. ............ 716/19 |
| 6,884,551 B2 * | 4/2005 | Fritze et al. ..................... 430/5 |
| 7,107,573 B2 * | 9/2006 | Yamazoe et al. .............. 716/21 |
| 7,185,312 B2 * | 2/2007 | Ki et al. ......................... 716/20 |
| 7,266,800 B2 * | 9/2007 | Sezginer ....................... 716/21 |
| 7,346,885 B2 * | 3/2008 | Semmler ...................... 716/19 |
| 7,392,502 B2 * | 6/2008 | Percin et al. .................. 716/19 |
| 7,444,615 B2 * | 10/2008 | Percin et al. .................. 716/19 |
| 7,444,616 B2 * | 10/2008 | Sandstrom et al. ............ 716/21 |
| 2003/0061595 A1 * | 3/2003 | Ki et al. ......................... 716/21 |
| 2003/0064298 A1 * | 4/2003 | Broeke et al. ................... 430/5 |
| 2003/0165749 A1 * | 9/2003 | Fritze et al. ..................... 430/5 |
| 2003/0198872 A1 * | 10/2003 | Yamazoe et al. ............... 430/5 |
| 2003/0220708 A1 * | 11/2003 | Sahin et al. ................. 700/121 |
| 2004/0158808 A1 * | 8/2004 | Hansen ......................... 716/21 |
| 2004/0229138 A1 * | 11/2004 | Ki et al. .......................... 430/5 |
| 2004/0253553 A1 * | 12/2004 | Sato et al. ................... 430/394 |
| 2004/0259042 A1 * | 12/2004 | Fritze et al. ................. 430/394 |
| 2004/0268289 A1 * | 12/2004 | Sandstrom et al. ............ 716/19 |
| 2005/0273753 A1 * | 12/2005 | Sezginer ....................... 716/21 |

(Continued)

OTHER PUBLICATIONS

Lee et al., "Analytic Modeling for the Limit of Mask Mean-to-Target from the photolithographic standpoint", Applied Physics Letters, vol. 84, No. 16, Apr. 2004, pp. 3004-4006.*

*Primary Examiner*—Phallaka Kik
(74) *Attorney, Agent, or Firm*—J.C. Patents

(57) ABSTRACT

A prediction model for exposure dose is indicated by the following formula, $E=E_0+E_C$, wherein E represents an optimized exposure dose, $E_0$ represents a preset exposure dose of a process control system, and $E_C$ represents an exposure dose compensation value, and $$E_C=[(MTT_{\mathit{diff}}/X)/(CD_{\mathit{mask}}/X)]\times(E_S/A')\times(W_{\mathit{last}}+W_{\mathit{avg}}),$$

wherein $MTT_{\mathit{diff}}$ represents the differences between the MTT value of a previous lot and the MTT value of a next lot, $CD_{\mathit{mask}}$ represents the actual critical dimension of the mask, X represents the magnification of the mask, $E_S$ represents the actual exposure dose of a previous lot, A' represents an experimental value obtained from the results of different lots, $W_{\mathit{last}}$ represents the last batch of weights and $W_{\mathit{avg}}$ represents an average weight, and $CD_{\mathit{mask}}$, $E_S$, A', $W_{\mathit{last}}$ and $W_{\mathit{avg}}$ are set parameters built into the process control system.

11 Claims, 1 Drawing Sheet

U.S. PATENT DOCUMENTS

| | | | |
|---|---|---|---|
| 2006/0070018 A1* | 3/2006 | Semmler ..................... | 716/21 |
| 2006/0177744 A1* | 8/2006 | Bodendorf et al. ............. | 430/5 |
| 2006/0183030 A1* | 8/2006 | Nakao ........................... | 430/5 |
| 2006/0266243 A1* | 11/2006 | Percin et al. ................ | 101/484 |
| 2006/0292460 A1* | 12/2006 | Sato et al. ...................... | 430/5 |
| 2007/0006116 A1* | 1/2007 | Percin et al. .................. | 716/21 |
| 2007/0061772 A1* | 3/2007 | Ye et al. ....................... | 716/21 |
| 2007/0061773 A1* | 3/2007 | Ye et al. ....................... | 716/21 |
| 2007/0239305 A1* | 10/2007 | Zhuang et al. ............. | 700/108 |

* cited by examiner

PREDICTION MODEL AND PREDICTION METHOD FOR EXPOSURE DOSE

BACKGROUND OF THE INVENTION

1. Field of the Invention

The present invention generally relates to a photolithographic process, and more particularly, to a prediction model and a prediction method for exposure dose.

2. Description of Related Art

In general, the basic parameter that affects the critical dimension (CD) of a photolithographic process is mainly the exposure dose. Conventionally, the control of the critical dimension of a photolithographic process is carried out after the exposure process. According to the result of the last measured critical dimension, compensation to the exposure dose is provided. Moreover, a preset exposure dose is given out through the dose setting system of the exposure machine so that the critical dimension value for the next lot of wafer is closer to the target value. The exposure dose can be measured by using a measuring machine to measure the photoresist pattern on a production wafer and using the measured result to provide an automatic feedback to the exposure machine. For example, an advanced process control (APC) method can be used such that the exposure machine operates under the control of ideal parameters.

However, the conventional method cannot and does not take into consideration the difference of the critical dimension of the mask and the deviation of critical dimension of line product from a baseline. Therefore, the critical dimension of the final exposure pattern often deviates from a target value or even exceeds the tolerable deviation so that the exposure conditions of the product must be modified anew. In other words, a reworking step of the exposure process must be executed. The so-called 'difference in the critical dimension of the mask' refers to the difference between the critical dimension of the initial design (that is, the target value) and the critical dimension actually fabricated on the mask.

Accordingly, when the semiconductor device is manufactured in the deep sub-micron dimensional range, dimension of the device is so small that the acceptable tolerance of the dimension of the designed device is also smaller. Under such circumstances, the photolithographic process is challenged. For example, considering the effect of the difference of the critical dimension of the mask on the pattern dimension that needs to be transfer and accurately finding the most appropriate exposure dose for manufacturing a device with acceptable tolerance is one of the targets of development for most manufacturers.

SUMMARY OF THE INVENTION

Accordingly, the present invention provides a prediction model and a prediction method for exposure dose capable of preventing the tolerance of the critical dimension of a mask from affecting the accuracy of the critical dimension of the final exposure pattern. Furthermore, an optimized exposure dose is also obtained to improve the process yield and decrease the production cost.

The present invention provides a prediction model for exposure dose. According to a mean of the differences between actual critical dimensions and the target values of a mask (MTT value), a corresponding exposure dose compensation value is obtained. Then, the exposure dose compensation value is used to correct an optimized exposure dose for the exposure process. The prediction model for the exposure dose is indicated by the following formula, $E=E_O+E_C$, wherein E represents an optimized exposure dose, $E_O$ represents a preset exposure dose of a process control system, and $E_C$ represents an exposure dose compensation value, and $$E_C=[(MTT_{\mathit{diff}}/X)/(CD_{mask}/X)]\times(E_S/A')\times(W_{last}+W_{avg}),$$

wherein $MTT_{\mathit{diff}}$ represents the differences between the MTT value of a previous lot and the MTT value of a next lot, $CD_{mask}$ represents the actual critical dimension of the mask, X represents the magnification of the mask, $E_S$ represents the actual exposure dose of a previous lot, A' represents an experimental value obtained from the results of different lots, $W_{last}$ represents the last batch of weights and $W_{avg}$ represents an average weight, and $CD_{mask}$, $E_S$, A', $W_{last}$ and $W_{avg}$ are set parameters built into the process control system.

According to the prediction model for exposure dose in an embodiment of the present invention, the process control system is an advanced process control (APC) system.

According to the prediction model for exposure dose in an embodiment of the present invention, the prediction model for exposure dose is suitable for an exposure machine using I-line, KrF or ArF as the exposure light source.

According to the prediction model for exposure dose in an embodiment of the present invention, the mean of the differences is a value obtained by dividing the sum of the differences between the actual critical dimensions and the target values by the number of measurements.

The present invention also provides a prediction method for exposure dose suitable for an exposure machine. By obtaining an optimized exposure dose for an exposure process, the pattern after an exposure is very similar to the target exposure pattern. The prediction method includes the following steps. First, dimensional data of a mask is provided and the dimensional data of a mask includes an actual critical dimension and a target value. The actual exposure doses of a previous lot in a process control system are also provided. Thereafter, the dimensional data of the mask and the actual exposure doses of the previous lot are input to the process control system. After that, a computation for finding an exposure dose compensation value ($E_C$) is executed, the prediction model is given by the following formula, $E_C=[(MTT_{\mathit{diff}}/X)/(CD_{mask}/X)]\times(E_S/A')\times(W_{last}+W_{avg})$, wherein $MTT_{\mathit{diff}}$ represents the differences between the MTT value of a previous lot and the MTT value of a next lot, $CD_{mask}$ represents the actual critical dimension of the mask, X represents the magnification of the mask, $E_S$ represents the actual exposure dose of a previous lot, A' represents an experimental value obtained from the results of different lots, $W_{last}$ represents the last batch of weights and $W_{avg}$ represents an average weight, and $CD_{mask}$, $E_S$, A', $W_{last}$ and $W_{avg}$ are set parameters built into the process control system. Next, the exposure dose compensation value and the sum of the preset exposure doses of the process control system are calculated to obtain the optimized exposure dose.

According to the prediction method for exposure dose in an embodiment of the present invention, before executing the computation for finding the exposure dose value ($E_C$), further includes performing a decision. If the input data are within an accepted data range, the computation for finding the exposure dose compensation value (EC) is executed. On the other hand, if the input data are outside the acceptable data range, a warning alarm is transmitted. The input data are the mean of the differences of the critical dimensions of the mask, the deviation of the mean of the differences and the actual exposure dose ($E_S$) of the previous lot, for example.

According to the prediction method for exposure dose in an embodiment of the present invention, the dimensional data of the mask is obtained through a mask inspection or provided by the mask manufacturer.

According to the prediction method for exposure dose in an embodiment of the present invention, the mean of the differences is a value obtained by dividing the sum of the differences between the actual critical dimensions and the target values by the number of measurements.

According to the prediction method for exposure dose in an embodiment of the present invention, the process control system is an advanced process control (APC) system.

According to the prediction method for exposure dose in an embodiment of the present invention, the exposure machine uses, for example, I-line, KrF or ArF as the exposure light source.

In the present invention, the factors related to the tolerance of the critical dimensions of a mask are feedback to a difference system that uses exposure dose to predict the critical dimension of a mask. Consequently, the predicted exposure dose is more accurate so that the critical dimension of the final exposure pattern can approach the target value and increase the production yield.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
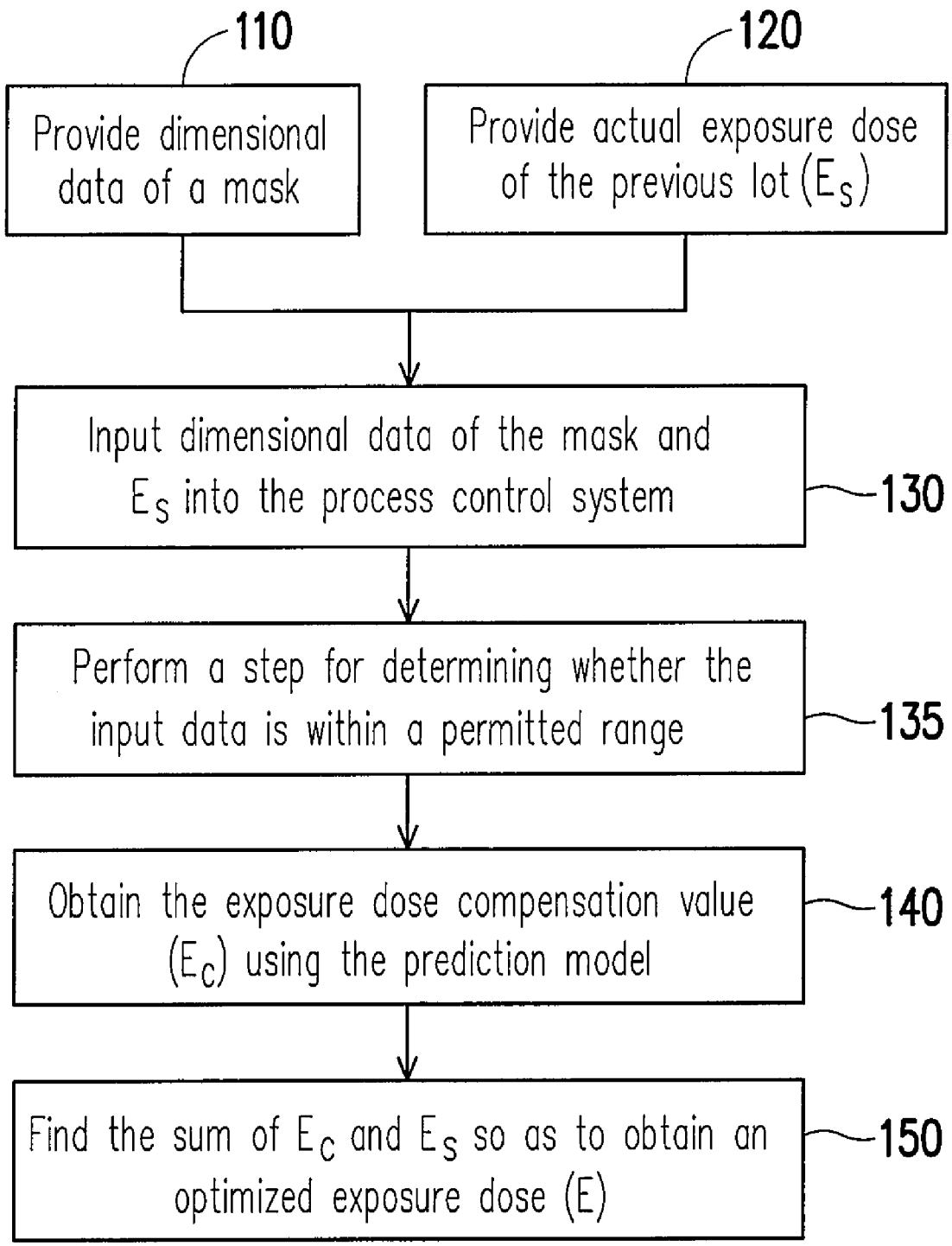
FIG. 1 is a flow diagram of a prediction method for exposure dose according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

With the continuous advance in semiconductor process, the permitted tolerance in the dimension of a designed device is smaller. As a result, any tolerance between the actual critical dimension and the target value of a mask has relatively more significant effect on the accuracy of the critical dimension of the final exposure pattern. For example, before performing each process, pilot wafers are normally used to perform process test to determine the set parameters and whether the operating conditions of the machine are normal or not. The results obtained from the pilot wafers are used to determine the process conditions of the lot. However, differences in the critical dimensions of the mask often lead to the problems of a lowering of the successful rate of the pilot wafers, an increase in the cycle time of the pilot wafers and a lowering of the process capability index (Cpk) of the pilot wafers. Obviously, most production line products have low yield and high production cost problems due to differences in the critical dimension of the mask in the production process. Therefore, the present invention provides a prediction model and a prediction method for exposure dose to resolve the problems encountered in the conventional exposure technique.

The prediction model for exposure dose of the present invention mainly uses the mean of differences between the critical dimensions (CD) and the target values of a mask or mean-to-target (MTT) to obtain a corresponding exposure dose compensation value ($E_C$). Then, the exposure dose compensation value is used to correct an optimized exposure dose (E) for the exposure process. The so-called 'the mean of the differences between the actual critical dimensions and the target values' in the above refers to a value obtained by dividing the sum of the differences between the actual critical dimensions and the target values by the number of measurements.

In other words, the prediction model for exposure dose of the present invention is given by the formula $E=E_0+E_C$, and $E_0$ is the preset exposure dose of a process control system in an exposure process. The process control system can be an Advanced Process Control (APC) system. The preset exposure dose ($E_0$) is the exposure dose set up by the exposure dose prediction unit of the process control system according to the compared results feedback to the exposure machine without any consideration regarding the condition of differences in the critical dimensions of the mask.

According to the foregoing description, the prediction model of the exposure dose compensation value ($E_C$) is given by the following formula, $$E_C=[(MTT_{diff}/X)/(CD_{mask}/X)]\times(E_S/A')\times(W_{last}+W_{avg}).$$

In the above formula, $MTT_{diff}$ represents the differences between the MTT value of a previous lot and the MTT value of a next lot, or in other words, the deviation of the mean of the differences between the critical dimensions of two masks. $CD_{mask}$ represents the actual critical dimension of the mask. X represents the magnification of the mask. In general, the value of X is 4 or 5 times. $MTT_{diff}/X$ represents the mean of the differences between the critical dimensions of the exposure pattern on a wafer, and $CD_{mask}/X$ represents the critical dimension of the exposure pattern on the wafer. Furthermore, $E_S$ represents the actual exposure dose of a previous lot. A' represents an experimental value obtained from the results of different lots. $W_{last}$ represents the last batch of weights. $W_{avg}$ represents an average weight. $CD_{mask}$, $E_S$, A', $W_{last}$ and $W_{avg}$ are set parameters built into the process control system.

According to the above, the prediction model for exposure dose of the present invention can feedback the factors, which affects the accuracy of the critical dimension in the last exposure pattern due to the tolerance of the critical dimension of the mask, to the difference system that uses exposure dose to predict the critical dimension of a mask so that the predicted exposure dose is more accurate. As a result, the successful rate of the pilot wafers is increased, the cycle time of the pilot wafers is lowered and the process capability index (Cpk) of the pilot wafers is increased. Furthermore, the process yield of the line product can be increased while the production cost of the line product can be reduced.

Next, a method of using the prediction model for exposure dose according to the present invention is described. FIG. 1 is a flow diagram of a prediction method for exposure dose according to an embodiment of the present invention.

As shown in FIG. 1, the method for predicting exposure dose in the present embodiment includes providing dimensional data of a mask (step 110). The dimensional data of the mask includes the target values of the critical dimensions of the mask and the actual critical dimensions on the mask. The dimensional data of the mask can be provided by the mask manufacturer or obtained through a mask inspection when the mask is received. Thereafter, the actual exposure dose ($E_S$) of a previous lot in a process control system is provided (step 120). The process control system is an Advanced Process Control (APC) system, for example.

Afterwards, the dimensional data of the mask and the actual exposure dose ($E_S$) of the previous lot are input to the process control system (step 130). More specifically, the step 130 is to input the data in steps 110 and 120 to a user interface (UI) of the process control system.

Next, a computation to find an exposure dose compensation value ($E_C$) is executed (step 140), and the prediction model of the exposure dose compensation value ($E_C$), namely, the formula $E_C=[(MTT_{diff}/X)/(CD_{mask}/X)]\times(E_S/A')\times(W_{last}+W_{avg})$, is used to obtain the corresponding exposure dose compensation value ($E_C$). According to the dimensional data of the mask in step 110, the value of $MTT_{diff}$ and $CD_{mask}$ can be computed. The other parameters $E_S$, A', $W_{last}$ and $W_{avg}$ in the formula of the prediction model for the exposure dose compensation value ($E_C$) can be custom values obtained from the historic data of previous process. The foregoing customary values can be obtained by fitting to a built-in formula of the process control system, for example.

Furthermore, in the actual processing operation before executing the computation for finding the exposure dose compensation value ($E_C$), a decision can be made to identify whether the input data is within a permitted range (step 135). The data to be identified are, for example, the mean of differences of the critical dimensions of the mask, the deviation of the mean of the difference and the actual exposure dose ($E_S$) of the previous lot. Here, the so-called 'permitted range' can be defined by an operator according to the process formula or the operating conditions of the machine. If the input data is within the permitted range, the computation for finding the exposure dose compensation value ($E_C$) is executed. On the other hand, if the input data is outside the permitted range, a warning alarm is transmitted. For example, in response to the alarm, a warning light may light up on the user interface and a warning bell may sound to inform the operator to take appropriate actions.

Next, the exposure dose compensation value ($E_C$) and the preset exposure dose ($E_S$) are summed to obtain an optimized exposure dose (E) (step 150). In step 150, the exposure dose compensation value ($E_C$) obtained in step 140 is feedback to the process control system and the exposure dose compensation value ($E_C$) is used to compensate the preset exposure dose ($E_S$) and obtain the optimized exposure dose (E).

After finishing the step 150, the optimized exposure dose (E) is output to the exposure machine for subsequent processing. The prediction method for exposure dose in the present invention is suitable for an exposure machine that uses I-line, KrF or ArF as its exposure light source.

In summary, the present invention has at least the following advantages:

1. In the present invention, the factors of the critical dimension tolerance of the mask are feedback to a predicting system for exposure dose. Therefore, variation of the critical dimensions of exposure pattern can be minimized and the critical dimensions of the exposure pattern can be closer to the target values.

2. The present invention can increase the success rate of the pilot wafers, lower the production cycle of the pilot wafers and increase the Cpk of the pilot wafers. Furthermore, the method of the present invention can be applied to line products for increasing process yield and lowering production cost.

3. The present invention can accurately predict the exposure dose. As a result, all the problems caused by using the conventional method for predicting the exposure dose can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for performing an exposure process, comprising:

an exposure machine; and a process control system, outputting an optimized exposure dose of the exposure process to the exposure machine based on a prediction model for exposure dose, such that according to a mean of differences between actual critical dimensions and target values of a mask (MTT), a corresponding exposure dose compensation value is obtained and the exposure dose compensation value is used to correct the optimized exposure dose of the exposure process, and the prediction model is given by a formula, $E=E_0+E_C$, wherein E represents the optimized exposure dose, $E_0$ represents a preset exposure dose of the process control system, $E_C$ represents the exposure dose compensation value, given by a formula, $$E_C=[(MTT_{diff}/X)/(CD_{mask}/X)]\times(E_S/A')\times(W_{last}+W_{avg}),$$

wherein $MTT_{diff}$ represents differences between the MTT value of a previous lot and the MTT value of a next lot, $CD_{mask}$ represents the actual critical dimension of the mask, X represents a magnification of the mask, $E_S$ represents an actual exposure dose of a previous lot, A' represents an experimental value obtained from results of different lots, $W_{last}$ represents a last batch of weights and $W_{avg}$ represents an average weight, and $CD_{mask}$, $E_S$, A', $W_{last}$ and $W_{avg}$ are set parameters built into the process control system.

2. The exposure apparatus according to claim 1, wherein the process control system is an advanced process control system.

3. The exposure apparatus according to claim 1, wherein the prediction model for exposure dose is suitable for the exposure machine that uses I-line, KrF or ArF as an exposure light source.

4. The exposure apparatus according to claim 1, wherein the mean of the differences is a value obtained by dividing a sum of the differences between the actual critical dimensions and the target values of the mask by the number of measurements.

5. A prediction method for exposure dose suitable for an exposure machine, and by obtaining an optimized exposure dose of an exposure process, the pattern obtained after an exposure is close to a target exposure pattern, the prediction method comprising:

providing dimensional data of a mask, wherein the dimensional data of the mask comprises an actual critical dimension and a target value;

providing an actual exposure dose of a previous lot in a process control system;

inputting the dimension data of the mask and the actual exposure dose of the previous lot into the process control system;

executing a computation for finding an exposure dose compensation value ($E_C$) by a computer, wherein a prediction model is given by the following formula, $$E_C=[(MTT_{diff}/X)/(CD_{mask}/X)]\times(E_S/A')\times(W_{last}+W_{avg}),$$

wherein $\text{MTT}_{diff}$ represents differences between an MTT value (a mean of differences between actual critical dimensions and target values of the mask) of a previous lot and the MTT value of a next lot, $CD_{mask}$ represents the actual critical dimension of the mask, X represents a magnification of the mask, $E_S$ represents the actual exposure dose of the previous lot, A' represents an experimental value obtained from results of different lots, $W_{last}$ represents a last batch of weights and $W_{avg}$ represents an average weight, and $CD_{mask}$, $E_S$, A', $W_{last}$ and $W_{avg}$ are set parameters built into the process control system; and summing the exposure dose compensation value and a preset exposure dose of the process control system to obtain the optimized exposure dose.

6. The prediction method for exposure dose according to claim 5, further comprising making a decision before executing the computation for finding the exposure dose compensation value ($E_C$), wherein the decision is to execute the computation for finding the exposure dose compensation value ($E_C$) if the input data are within a permitted range and transmit an alarm signal if the input data are outside the permitted range.

7. The prediction method for exposure dose according to claim 6, wherein the input data comprises mean of the differences between the critical dimensions of the mask, deviation of the mean of differences and the actual exposure dose ($E_S$) of the previous lot.

8. The prediction method for exposure dose according to claim 5, wherein the critical dimension of the mask is obtained through a mask inspection when the mask is received or provided by a mask manufacturer.

9. The prediction method for exposure dose according to claim 5, wherein the mean of the differences is a value obtained by dividing the sum of the differences between the actual critical dimensions and the target values by the number of measurements.

10. The prediction method for exposure dose according to claim 5, wherein the process control system is an advanced process control system.

11. The prediction method for exposure dose according to claim 5, wherein the exposure machine comprises an exposure machine that uses I-line, KrF or ArF as an exposure light source.

* * * * *